US010928724B2

(12) United States Patent
Wu et al.

(10) Patent No.: US 10,928,724 B2
(45) Date of Patent: Feb. 23, 2021

(54) ATTACHMENT FEATURE REMOVAL FROM PHOTOMASK IN EXTREME ULTRAVIOLET LITHOGRAPHY APPLICATION

(71) Applicant: Applied Materials, Inc., Santa Clara, CA (US)

(72) Inventors: Banqiu Wu, San Jose, CA (US); Eli Dagan, Sunnyvale, CA (US); Khalid Makhamreh, Los Gatos, CA (US); Bruce J. Fender, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/661,541

(22) Filed: Oct. 23, 2019

(65) Prior Publication Data

US 2020/0183268 A1    Jun. 11, 2020

Related U.S. Application Data (60) Provisional application No. 62/777,557, filed on Dec. 10, 2018.

(51) Int. Cl.
| | | |
|---|---|---|
| *G03F 1/82* | (2012.01) | |
| *G03F 7/20* | (2006.01) | |
| *G03F 1/62* | (2012.01) | |
| *G03F 1/64* | (2012.01) | |

(52) U.S. Cl.
CPC ............... *G03F 1/82* (2013.01); *G03F 1/62* (2013.01); *G03F 1/64* (2013.01); *G03F 7/70741* (2013.01); *G03F 7/70983* (2013.01); *H01L 2924/00* (2013.01)

(58) Field of Classification Search
CPC ..... G03F 1/62; G03F 1/64; G03F 1/82; G03F 7/70741; G03F 7/70916; G03F 7/70983; H01L 2924/00

USPC .................... 355/30, 75, 77; 430/5
See application file for complete search history.

(56) References Cited

U.S. PATENT DOCUMENTS

| | | |
|---|---|---|
| 6,781,673 B2 | 8/2004 | Moors et al. |
| 7,367,138 B2 | 5/2008 | Sogard |
| 8,476,167 B2 | 7/2013 | Van Mierlo et al. |
| 2003/0071979 A1 | 4/2003 | Visser |
| 2005/0051421 A1 | 3/2005 | Quesnel et al. |

(Continued)

FOREIGN PATENT DOCUMENTS

| | | |
|---|---|---|
| EP | 0843352 A1 | 5/1998 |
| JP | 4455749 B2 | 4/2010 |

(Continued)

OTHER PUBLICATIONS

PCT Notification of Transmittal of the International Search Report and the Written Opinion of the International Searching Authority for International Application No. PCT/US2019/057470, dated Mar. 26, 2020; 11 total pages.

*Primary Examiner* — Colin W Kreutzer
(74) *Attorney, Agent, or Firm* — Patterson + Sheridan, LLP (57) ABSTRACT

Embodiments of the present disclosure generally provide apparatus and methods for removing an attachment feature utilized to hold a pellicle from a photomask. In one embodiment, an attachment feature removal apparatus for processing a photomask includes an attachment feature puller comprising an actuator, a clamp coupled to the actuator, the clamp adapted to grip an attachment feature, and a coil assembly disposed adjacent to the attachment feature.

19 Claims, 7 Drawing Sheets

(56) References Cited

U.S. PATENT DOCUMENTS

| | | |
|---|---|---|
| 2005/0242300 A1 | 11/2005 | Silverman |
| 2005/0275835 A1 | 12/2005 | Sogard |
| 2009/0186282 A1 | 7/2009 | Wu et al. |
| 2010/0279212 A1* | 11/2010 | Shirasaki ................. G03F 1/64 430/5 |
| 2011/0037960 A1 | 2/2011 | Scaccabarozzi et al. |
| 2013/0070218 A1 | 3/2013 | Ivanov et al. |
| 2016/0172253 A1 | 6/2016 | Wu et al. |
| 2020/0012204 A1* | 1/2020 | Van Der Meulen ......................... G03F 7/70825 |

FOREIGN PATENT DOCUMENTS

| | | | |
|---|---|---|---|
| WO | 2008042180 A1 | 4/2008 | |
| WO | WO-2016079052 A2 * | 5/2016 | ............... G03F 1/64 |

* cited by examiner

ATTACHMENT FEATURE REMOVAL FROM PHOTOMASK IN EXTREME ULTRAVIOLET LITHOGRAPHY APPLICATION

CROSS-REFERENCE TO RELATED APPLICATION

This application claims benefit of U.S. Provisional Application Ser. No. 62/777,557 filed Dec. 10, 2018, which is incorporated by reference in its entirety.

BACKGROUND

Field

Embodiments of the present disclosure generally relate to methods and apparatus for an attachment feature removal process from a photomask. Particularly, embodiments of the present disclosure provide methods and apparatus for pellicle stud removal from an attachment feature on a photomask by local induction heating for lithography applications.

Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

With the shrink of critical dimensions (CD), present optical lithography is approaching a technological limit at the 45 nanometer (nm) technology node. Next generation lithography (NGL) is expected to replace the conventional optical lithography method, for example, in the 32 nm technology node and beyond. There are several NGL candidates, such as extreme ultraviolet (EUV) lithography (EUVL), electron projection lithography (EPL), ion projection lithography (IPL), nano-imprint, and X-ray lithography. Among these, EUVL is the most likely successor due to the fact that EUVL has most of the properties of optical lithography, which is more mature technology as compared with other NGL methods.

Typically, one photomask, e.g., a reticle, may be repeatedly used to reproducibly print thousands of substrates. Typically, a photomask, e.g., a reticle, is typically a glass or a quartz substrate giving a film stack having multiple layers, including a light-absorbing layer and an opaque layer disposed thereon. While performing the photolithography process, a pellicle is used to protect the reticle from particle contamination. Pellicle is a thin transparent membrane which allows lights and radiation to pass therethrough to the reticle. The pellicle is a relatively inexpensive, thin, transparent, flexible sheet, which is stretched above and does not touch the surface of the mask. Pellicles provide a functional and economic solution to particulate contamination by mechanically separating particles from the mask surface. After the photomask has been used for a number of cycles and the pellicle has become damaged or too dirty to use, the photomask is removed and the pellicle replaced.

Pellicles are typically supported and held on the reticle by an attachment feature. The attachment feature is used to secure the pellicle on the photomask when in use. However, when replacing the pellicle and the attachment feature from the photomask, damage is often caused to the photomask by a mechanical force utilized to pull off the attachment feature. Furthermore, in some cases, thermal energy is used to soften the attachment feature when replacing the pellicle and removing the attachment feature. However, such thermal energy may inevitably damage the film stack and/or structures of the photomask.

Therefore, there is a need for apparatus and methods for replacing a pellicle and an attachment feature on the reticle after periodic use.

SUMMARY

Embodiments of the present disclosure generally provide apparatus and methods for removing an attachment feature utilized to hold a pellicle from a photomask. In one embodiment, an attachment feature removal apparatus for processing a photomask includes an attachment feature puller comprising an actuator, a clamp coupled to the actuator, the clamp adapted to grip an attachment feature, and a coil assembly disposed adjacent to the attachment feature.

In another embodiment, a method for removing an attachment feature from a photomask includes positioning an attachment feature puller to surround an attachment feature disposed on a photomask, heating the attachment feature by induction heating, moving the attachment feature puller to grip attachment feature, applying a mechanical force to the attachment feature puller, and removing the attachment feature from the photomask.

In yet another embodiment, an attachment feature removal apparatus for processing a photomask includes a clamp coupled to an actuator disposed in an attachment feature removal apparatus, wherein the clamp is fabricated from an insulating material and a coil assembly disposed around an attachment feature received in the clamp.

BRIEF DESCRIPTION OF THE DRAWINGS

So that the manner in which the above recited features of embodiments of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure generally provide apparatus and methods for removing an attachment feature utilized to hold a pellicle from a photomask. The attachment feature is utilized to hold and/or support a pellicle to the photomask. The attachment feature includes a pellicle stud holding the pellicle and an adhesive layer attached between the pellicle stud and the photomask. An attachment feature removal apparatus is utilized to remove the attachment feature from the photomask. In one example, the attachment feature removal apparatus includes an attachment feature puller having a pellicle stud gripper that can provide induction heating energy through an inductive coil assembly disposed around the pellicle stud gripper. With induction heating from the pellicle stud gripper, the adhesive layer at the interface may be softened, thus facilitating efficient pulling of the pellicle stud from the photomask. The adhesive layer may be pulled from the photomask along with the pellicle stud, or an additional adhesive layer removal process may be performed to remove the adhesive layer from the photomask as needed.

Figure 1:
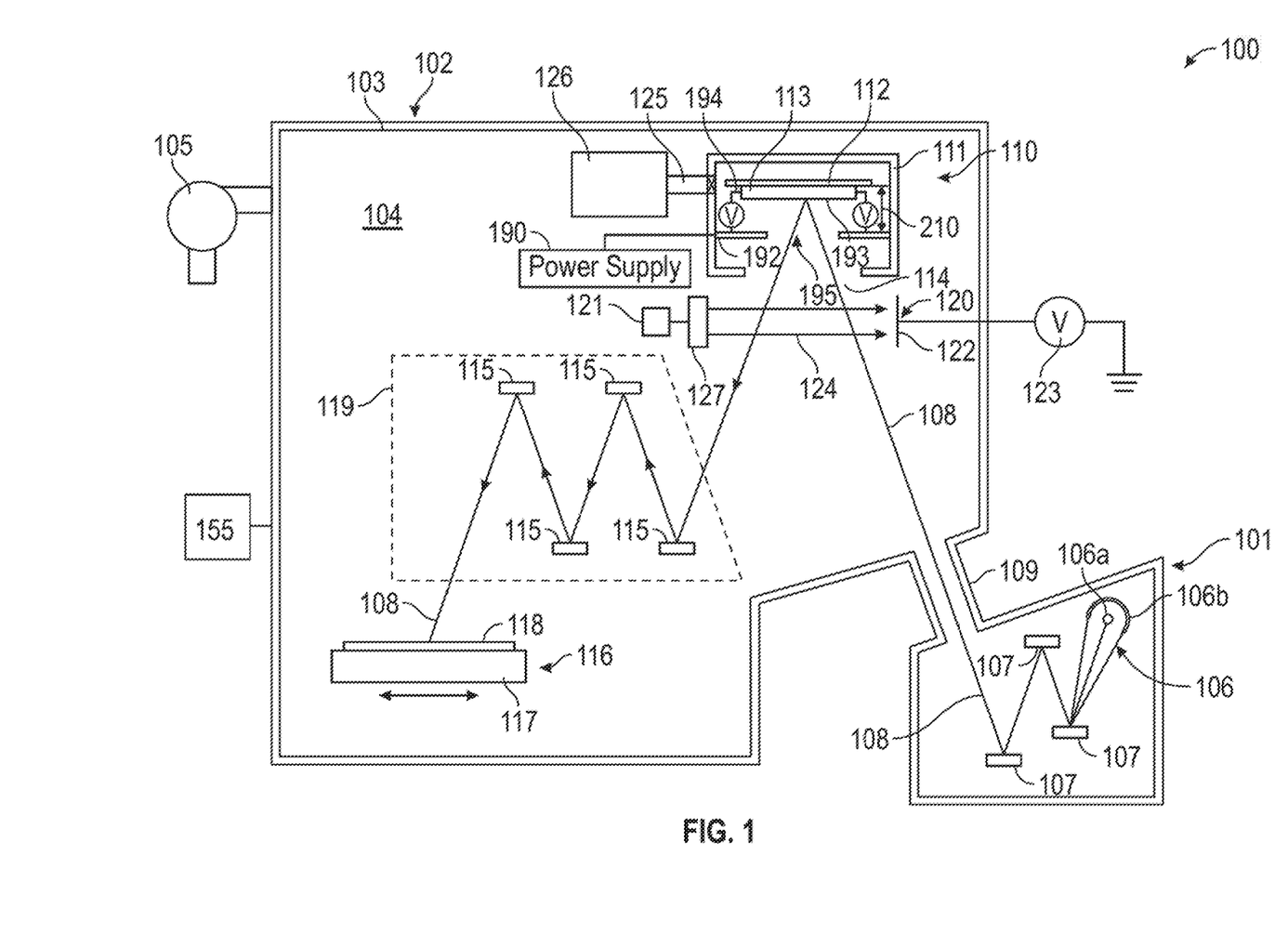
FIG. 1 schematically illustrates a lithography system in accordance with one embodiment of the present disclosure.

FIG. 1 schematically illustrates a lithography system 100 in accordance with one embodiment of the present disclosure. The lithography system 100 generally comprises a radiation system 101 configured to generate a beam of radiation 108 to be used during a lithography process. The lithography system 100 further comprises a lithography apparatus 102 in connection with the radiation system 101 via a wave train 109.

The radiation system 101 generally comprises a radiation source 106 and a projection system 107. In one embodiment, the radiation source 106 may comprise a laser produced plasma 106a and a collection mirror 106b. In one embodiment, the radiation system 101 may be configured to generate extreme ultraviolet (EUV) radiation with a wavelength in the range of 5 nm to 20 nm. The radiation system 101 is configured to project a beam of radiation 108 towards the lithography apparatus 102 for a lithographic process.

The lithography apparatus 102 comprises a body 103 defining an inner volume 104. During processing, the inner volume 104 may be maintained at a vacuum using a pumping system 105 as processing in a vacuum state reduces the potential for particle contamination. The lithography apparatus 102 further comprises a mask station 110, a projection system 119, a substrate stage 116, and a particle removal station 120, which are disposed in the inner volume 104.

The mask station 110 is configured to position a photomask 113, e.g., a reticle, which is configured to receive and reflect the beam of radiation 108 to the projection system 119. The photomask 113 has a pattern formed thereon and the pattern is reflected in the beam of radiation 108 by the photomask 113. The projection system 119 is configured to project the beam of radiation 108 and convey the pattern to a substrate 118 positioned on the substrate stage 116 which is configured to precisely position the substrate 118. The substrate 118 utilized here may be a semiconductor substrate fabricated from crystalline silicon, doped silicon, or composited silicon substrate including one or more nonconductive materials, dielectric materials or conductive layers disposed thereon depending on the application. The substrate 118 is not limited to any particular size or shape. The substrate 118 can be a round wafer having a 200 mm diameter, a 300 mm or a 450 mm diameter. The substrate can also be any polygonal, square, rectangular, curved or otherwise non-circular workpiece, such as a glass substrate as needed.

The particle removal station 120 is disposed in a path of the beam of radiation 108 and configured to remove debris and particles travelling along the beam of radiation 108. In one embodiment, the particle removal station 120 is positioned near the mask station 110, intersecting the input and output paths of the beam of radiation 108 to and from the photomask 113.

The mask station 110 comprises a chamber body 111 having a shutter opening 114 configured to transmit the beam of radiation 108 during processing. The photomask 113 is positioned on a mask stage 112 configured to position photomask 113 to align with the beam of radiation 108 and the projection system 119. The mask stage 112 may be moved in X-Y directions or be moved relative to the beam of radiation 108 so as to ensure features/structures on the photomask 113 are exposed to beam of radiation 108 as needed during a lithography process. In case of EUV lithography, the photomask 113 is directly exposed to the beam of radiation 108 and the ambient of the inner volume 104 without any protection because all materials are opaque to EUV wavelength. However, an optional shutter may be disposed in the shutter opening 114 and be closed while not processing.

A conductive plate 192 is disposed in the mask station 110 spaced apart from a front surface 193 of the photomask 113 in a parallel arrangement with the photomask 113. The conductive plate 192 may be in form of a metal plate, a metal ring, or any suitable conductive structure having an opening 195 that allows the beam of radiation 108 passing therethrough to the front surface 193 of the photomask 113. The conductive plate 192 may be coupled to sidewalls of the chamber body 111 and is removable from the mask station 110 for periodic cleaning. In one embodiment, the conductive plate 192 is positioned at a distance 110 between about 10 mm and about 30 mm to the mask stage. A power source 190 is coupled to the conductive plate 192 by a circuit arrangement 194. As the photomask 113 may have conductive materials disposed thereon during operation, the conductive plate 192 and conductive materials disposed on the photomask 113 may each act as electrodes that may generate electrical field therebetween upon applying a power. A voltage V may be applied to the conductive plate 192, establishing an electric field creating an electric potential, which may repel, e.g., push, charged particles away from the surface 193 of the photomask 113. By doing so, cleanliness of the front surface 193 of the photomask 113 may be maintained. In one embodiment, the voltage V may be applied to the conductive plate 192 for between about 50 Volts and about 500 Volts. The photomask 113 may be ground as needed.

The mask station 110 may further comprise a mask transfer mechanism 125 configure to transfer the photomask 113 to and from a mask storage 126, where different masks may stored in a sealed condition.

The projection system 119 comprises a plurality of mirrors 115 configured to reflect the beam of radiation 108 towards the substrate 118. The projection system 119 may comprise up to 10 mirrors. The projection system 119 may comprise a projecting column (not shown) configured to project the beam of radiation 108 from the plurality of mirrors 115 to the substrate 118 at a desired ratio and a desired location.

The substrate stage 116 generally comprises a substrate support 117 which is configured to support, translate and rotate the substrate 118 to enable the beam of radiation 108 to be projected to a plurality of dies.

The particle removal station 120 is configured to remove any debris particles travelling within the beam of radiation 108 to protect the mask 113, the mirrors 115 and the substrate 118. The particle removal station 120 may be positioned anywhere in the path of the beam of radiation 108.

A system controller 155, much like a computing device, generally includes a central processing unit (CPU), a memory, and support circuit. The CPU may be one of any form of a general purpose computer processor that can be used in an industrial setting. The system controller 155 controls the operation of the lithography system 100. The support circuits are conventionally coupled to the CPU 138 and may comprise cache, clock circuits, input/output subsystems, power supplies, and the like. The software routines transform the CPU into a specific purpose computer (controller). The software routines may also be stored and/or executed by a second controller (not shown) that is located remotely from the lithography system 100.

Figure 2:
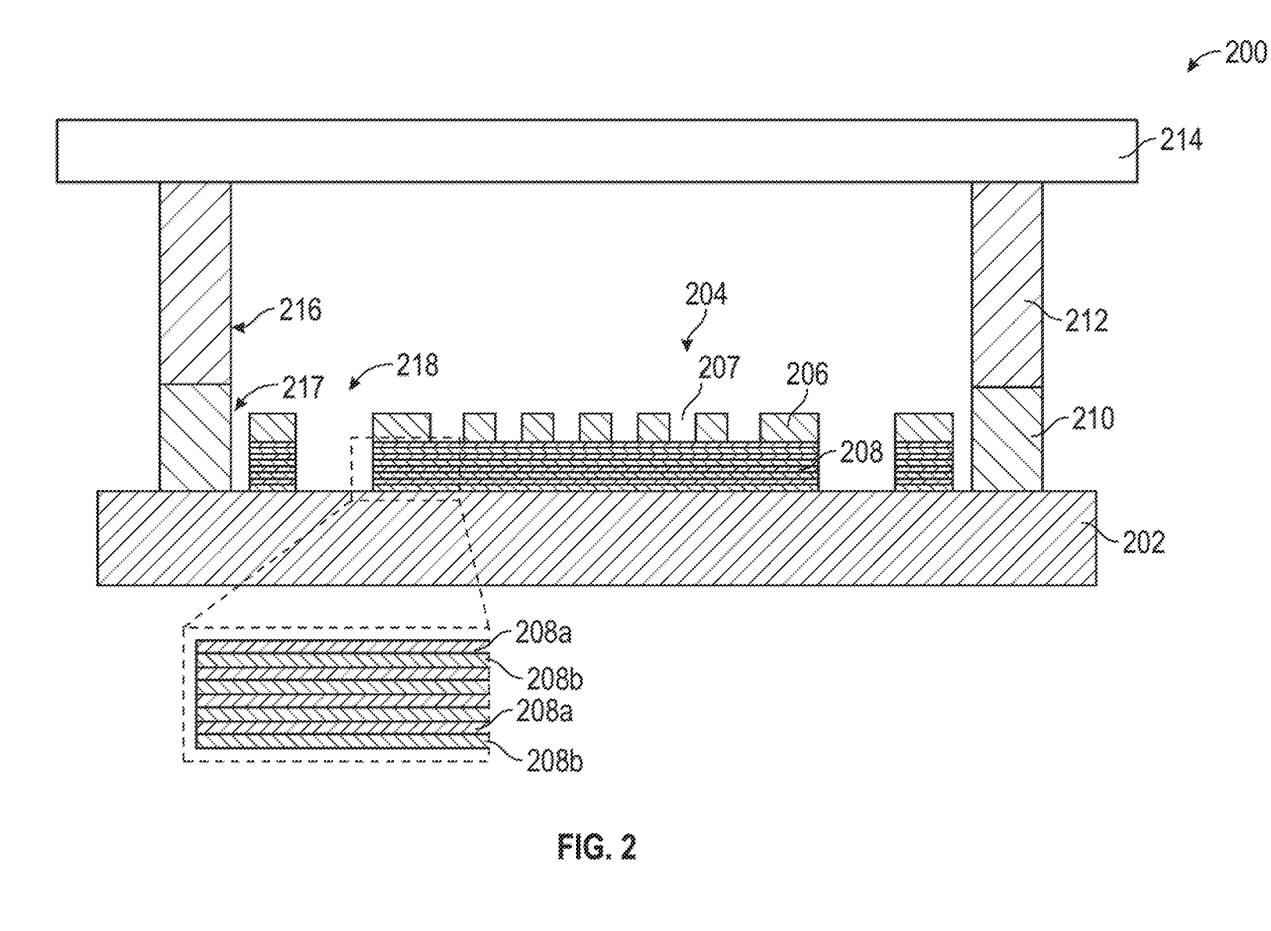
FIG. 2 schematically illustrates a cross sectional view of a photomask that may be used in the lithography system of FIG. 1.

FIG. 2 depicts details of a film stack 204 disposed on a photomask 202, such as a reticle. The photomask 202 may be similar to the photomask 113 that may be processed at the lithography system 100 depicted in FIG. 1. The photomask 202 includes the film stack 204 disposed on the photomask 202 having desired features 207 formed therein. In the exemplary embodiment depicted in FIG. 2, the photomask 202 may be a quartz substrate (i.e., low thermal expansion silicon dioxide ($SiO_2$)). The photomask 202 has a rectangular shape having sides between about 5 inches to about 9 inches in length. The photomask 202 may be between about 0.15 inches and about 0.25 inches thick. In one embodiment, the photomask 202 is about 0.25 inches thick. An optional conductive layer (not shown), for example a chromium containing layer, such as a chromium nitride (CrN) layer may be disposed to the back surface of the photomask 202 as needed.

The film stack 204 includes features 207 formed therein. It is noted that the features 207 and the film stack 204 depicted in FIGS. 2-7 are only for illustration purpose so that the features 207 and the film stack 204 may be in any form as needed. The film stack 204 includes an EUV reflective multi-material layer 208 and an absorber layer 206 disposed on the EUV reflective multi-material layer 208. The EUV reflective multi-material layer 208 may include at least one molybdenum layer 208a and a silicon layer 208b. Although the embodiment depicted in FIG. 2 shows four pairs of molybdenum layer 208a and a silicon layer 208b (alternating molybdenum layers 208a and the silicon layers 208b repeatedly formed on the photomask 202), it is noted that number of molybdenum layers 208a and the silicon layers 208b may be varied based on different process needs. In one particular embodiment, forty pairs of molybdenum layers 208a and the silicon layers 208b may be deposited to form the reflective multi-material layer 208. In one embodiment, the thickness of each single molybdenum layer 208a may be controlled at between about 1 nm and about 10 nm, such as about 2.7 nm, and the thickness of the each single silicon layer 208b may be controlled at between about 1 nm and about 10 nm, such as about 4.1 nm. The reflective multi-material layer 208 may have a total thickness between about 10 nm and about 500 nm. The reflective multi-material layer 208 may have an EUV light reflectivity of up to 70% at 13.5 nm wavelength. The reflective multi-material layer 208 may have a total thickness between about 70 nm and about 500 nm.

An absorber layer 206 may then be disposed on the reflective multi-material layer 208. The absorber layer 206 is an opaque and light-shielding layer configured to absorb a portion of the light generated during the lithography process. The absorber layer 206 may be in form of a single layer or a multi-layer structure. The absorber layer 206 may also further include a self-mask layer disposed on a bulk absorber layer. In one embodiment, the absorber layer 206 has a total film thickness of between about 50 nm and about 200 nm. The total thickness of the absorber layer 206 advantageously facilitates meeting the strict overall etch profile tolerance for EUV masks in sub-32 nm technology node applications.

In one embodiment wherein the absorber layer 206 includes a self-mask layer disposed on a bulk absorber layer, the bulk absorber layer may comprise tantalum-based materials with essentially no oxygen, for example tantalum silicide based materials, such as TaSi, nitrogenized tantalum boride-based materials, such as TaBN, and tantalum nitride-based materials, such as TaN. The self-mask layer may be fabricated from a tantalum and oxygen-based materials. The composition of the self-mask layer corresponds to the composition of the bulk absorber layer and may comprise oxidized and nitrogenized tantalum and silicon based materials, such as TaSiON, when the bulk absorber layer comprises TaSi or TaSiN; tantalum boron oxide based materials, such as TaBO, when the bulk absorber layer comprises TaBN; and oxidized and nitrogenized tantalum-based materials, such as TaON, when the bulk absorber layer comprises TaN. The features 207 (i.e., openings) are formed in the film stack 204 exposing the photomask.

Additionally, a capping layer (not shown) may be optionally disposed between the reflective multi-material layer 208 and the absorber layer 206. The capping layer may be fabricated from a metallic material, such as ruthenium (Ru) material, zirconium (Zr) material, or any other suitable material. In the embodiment depicted in FIG. 2, the capping layer is a ruthenium (Ru) layer. The capping layer has a thickness between about 1 nm and about 10 nm.

In a predetermined location 217 of the photomask 202, an attachment fixture 216 is formed thereon to support a pellicle 214, as shown in FIG. 2. The attachment fixture 216 includes a pellicle stud 212 utilized to hold the pellicle 214 and an adhesive layer 210 utilized to assist attaching the pellicle stud 212 to the photomask 202. The pellicle stud 212 may be made of any suitable material, such as metal containing materials, conductive materials, plastic materials, dielectric materials, or other materials suitable to hold the pellicle 214. In one example, the pellicle stud 212 is a conductive material selected from a group consisting of titanium, aluminum, stainless steel, combinations thereof and alloys thereof. The adhesive layer 210 may be any suitable glue layer, such as epoxy. The interface between the pellicle stud 212 and the pellicle 214 may include mechanical clamping mechanism to assist attaching the pellicle 214 securely on the pellicle stud 212 as needed.

Figure 3A:
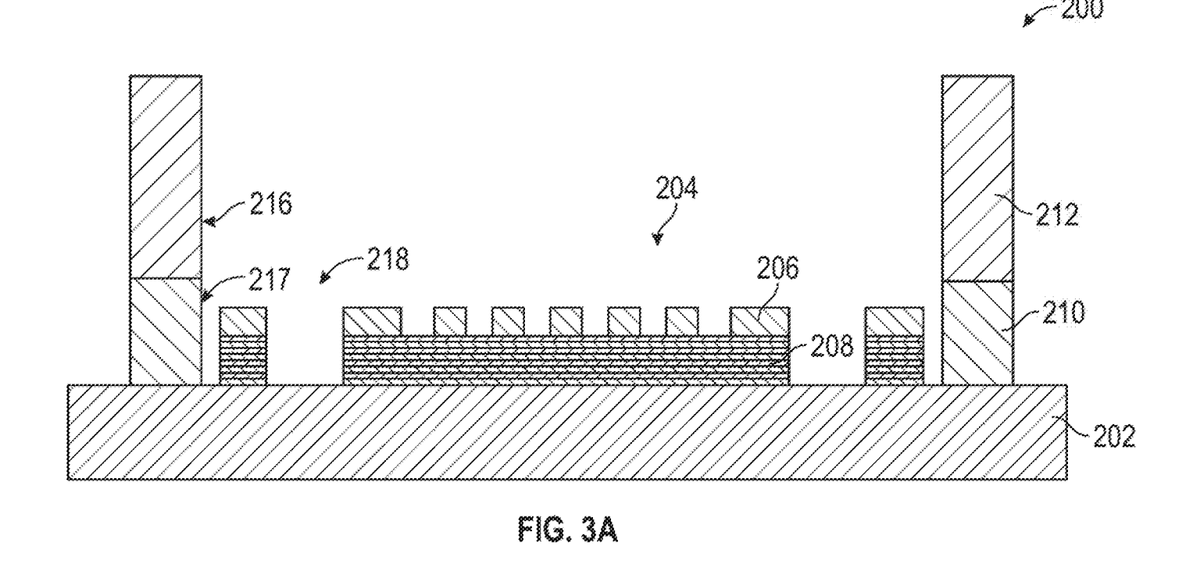
FIG. 3A schematically illustrates a cross sectional view of the photomask of FIG. 2 after pellicle is removed from the photomask.
Figure 3B:
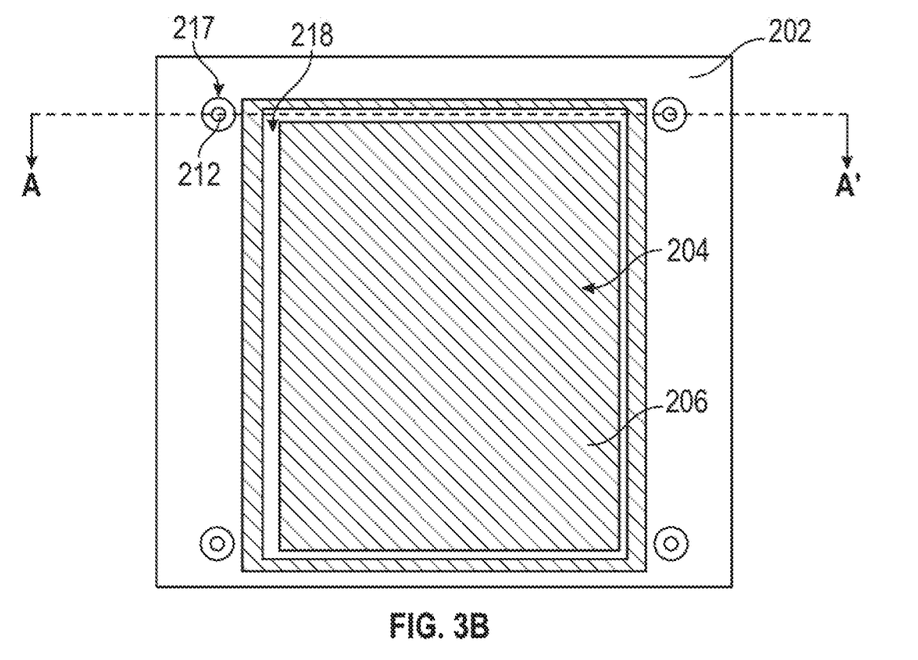
FIG. 3B illustrates a top view of the photomask of FIG. 2 after pellicle is removed from the photomask.
Figure 4:
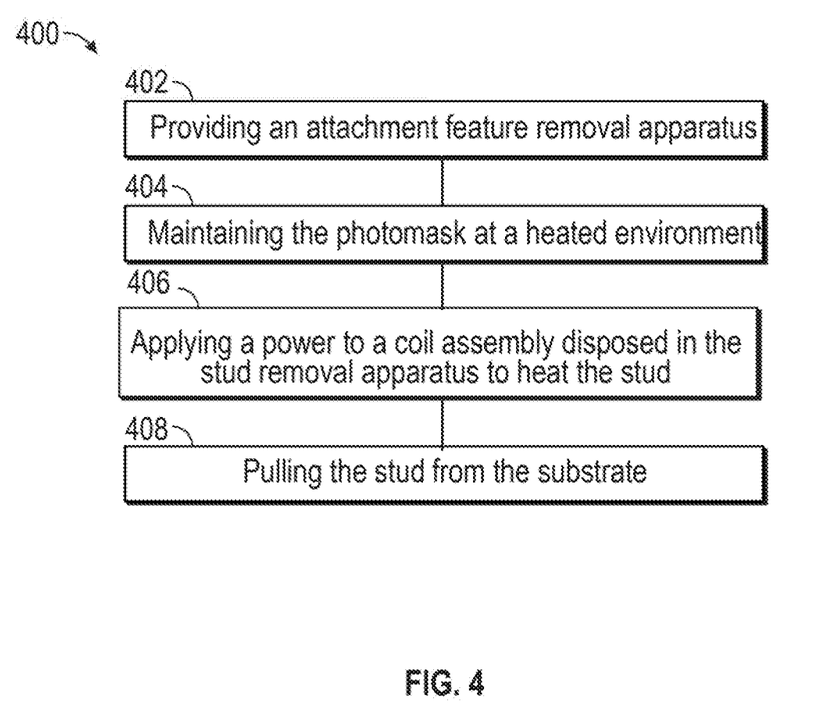
FIG. 4 depicts a flow chart of an attachment feature removal process for removing an attachment fixture from a reticle.

Prior to the attachment feature removal process depicted in FIG. 4, the pellicle 214 may be removed from the attachment fixture 216, as shown in FIG. 3A, by any suitable manner or mechanism. FIG. 3B depicts a top view of the photomask 202. FIG. 3A depicts the cross sectional view along the cutting line A-A' shown in FIG. 3B. The attachment fixtures 216 are located at predetermined locations 217 (e.g., corners) of the photomask 202. Although the embodiment depicted in FIG. 3B shows four locations for the attachment fixture 216 disposed thereon, it is noted that any number of the attachment fixtures 216 may be utilized as needed.

Figure 5A:
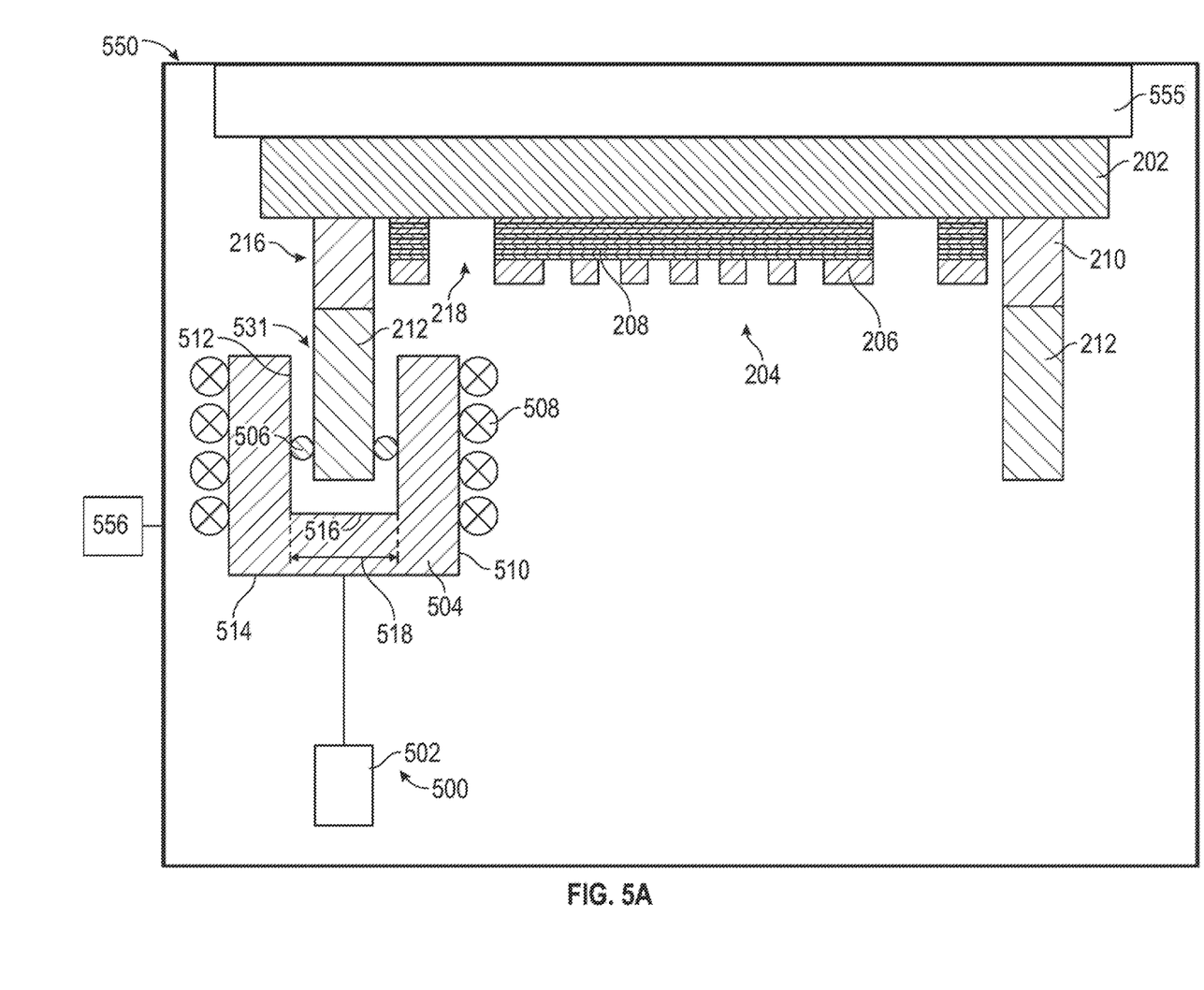
FIGS. 5A-5B illustrate cross sectional views of the photomask during different stages of the removal process of FIG. 4.
Figure 5B:
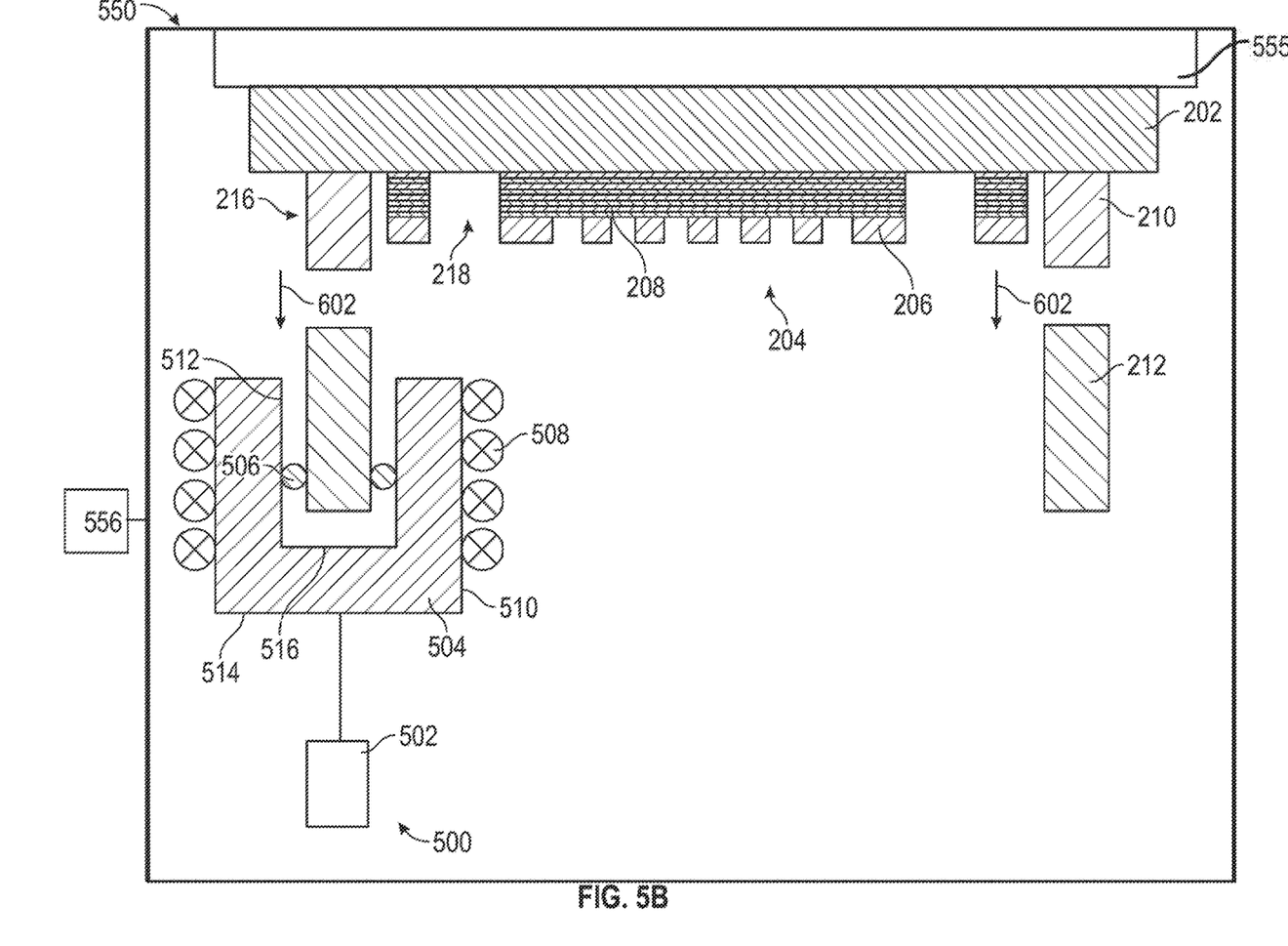

FIG. 4 depicts an attachment feature removal process 400 that may be utilized to remove the attachment fixture 216 from the photomask 202. FIGS. 5A-5B depict cross sectional views of the photomask 202 in an attachment feature removal apparatus 550 at different stages of the attachment feature removal process 400 of FIG. 4. It is noted that the photomask 202 and the film stack 204 disposed thereon depicted in FIGS. 5A-5B is flipped in an upside down position for ease of explanation.

The attachment feature removal process 400 starts at operation 402 by providing the photomask 202 in an attachment feature removal apparatus, such as the attachment feature removal apparatus 550 depicted in FIG. 5A. The attachment feature removal apparatus 550 may provide an enclosure that has more than one attachment feature puller 500 disposed therein. The attachment feature puller 500 is configured to remove the pellicle stud 212 from the photomask 202. The number of the attachment feature pullers 500 may be selected to uniquely pair with the number of the attachment fixture 216 to be removed from the photomask 202. In the embodiment depicted herein, four attachment feature pullers 500 (only one is shown in FIGS. 5A-5B) may be used remove the four attachment fixture 216 (shown in FIG. 3B) disposed at the corners of the photomask 202.

The attachment feature puller 500 includes an actuator 502 coupled to a pellicle stud gripper 504. The actuator 502 is operable to move the pellicle stud gripper 504 in the vertical direction (or in the z-direction). Movement of the pellicle stud gripper 504 may be in the x, y and z directions controlled by the actuator 502. The actuator 502 may assist positioning the pellicle stud gripper 504 to house the pellicle stud 212 at a proper coordinate for gripping. The pellicle stud gripper 504 includes a pair of sidewalls 510 connected by a bottom 504, forming an opening 531 adapted to receive or house the pellicle stud 212 when in operation. The pair of the sidewalls 510 may be extended upwards in a vertical direction to establish the opening 531 having a width 518 wider than a width of the pellicle stud 212 so that the pellicle stud 212 can be properly positioned therein without damage. A pair of clamps 506 may be disposed in the opening 531 which are actuatable against the pair of the sidewalls 510 (e.g., an inner wall of the sidewalls 510 in the opening 531) respectively to grip and/or clamp the pellicle stud 212 disposed therein. As the pellicle stud 212 may be varied in different sizes and dimensions, the clamps 506 disposed in the opening 531 facilitate securely gripping the pellicle stud 212 while accommodating different pellicle stud size and geometry.

In one example, the pellicle stud gripper 504 may be fabricated from insulating materials, plastic materials, dielectric materials, or suitable materials. In one example, the pellicle stud gripper 504 is fabricated from an insulator material, such as refractory materials. The clamps 506 may be made any suitable material, such as an insulating materials, plastic materials, dielectric materials, or suitable materials. In one example, the clamps 506 are fabricated from an insulator material selected from a group consisting of ceramics, refractory material and high temperature fibers.

A coil assembly 508 may be disposed around the sidewalls 510 (e.g., an outer wall of the sidewalls 510) of the pellicle stud gripper 504. The coil assembly 508 includes a cylindrical induction coil having one or more helical windings. It is noted that the windings of the coil electrically are connected in series. Alternatively, the coil assembly 508 may be positioned anywhere close to the pellicle stud 212 to as to provide heat energy to the pellicle stud 212 when in operation.

When the coil assembly 508 is powered (e.g., applying a voltage thereto via a power supply), the electric current inside coils may generate heat inside pellicle stud 212 by the induction current in the pellicle stud 212. Induction heating generally does not transmit heat to the insulator parts, such as the pellicle stud gripper 504 and the clamps 506. The coils predominately generate induction heat in the pellicle stud 212 (e.g., without physical contact with the pellicle stud 212) disposed in the opening 531 of the pellicle stud gripper 504. The induction heating generated from the coil assembly 508 generally heats an electrically conducting object, such as a conductive material from the pellicle stud 212. By utilizing an electronic magnetic field generated by the current flowing in the coil assembly 508, the heat is generated inside the pellicle stud 212 by induction, instead of direct heat contact to the pellicle stud 212. By doing so, the adhesive layer 210 coupled to the pellicle stud 212 may be quickly heated in the area near the pellicle stud 212 and quickly melted in a relatively high temperature condition, creating a loose or softened interface between the adhesive layer 210 and the photomask 202, or the interface between the adhesive layer 210 and the pellicle stud 212. When the interfaces to the adhesive layer 210 are softened or loosened, a relatively low mechanical force may be then applied from the actuator 502, actuating the pellicle stud gripper 504 to pull the pellicle stud 212 from the photomask 202, as shown in arrow 602 depicted in FIG. 5B. The actuator 502 moves the pellicle stud gripper 504 upwards to a position shown in FIG. 5A. Subsequently, the actuator 502 moves the pellicle stud gripper 504 downward, pulling the pellicle stud gripper 504 along with the pellicle stud 212 vertically downward to a position away from the photomask 202, as shown in FIG. 5B. Heat is delivered to the pellicle stud 212 by induction in order to render the adhesive layer 210 in a condition (i.e., softened or melted) that allows the pellicle stud 212 to readily be removed from the photomask 202. Once the adhesive layer 210 has melted near the interface of the pellicle stud 212 and the adhesive layer 210, creating a softened or loose interface, the pellicle stud 212 becomes detached from the photomask 202. The pellicle stud 212 is then removed easily when pulling downwards by the pellicle stud gripper 504 without damage. Thus, the coil assembly 508 may be positioned close to the pellicle stud gripper 504 or any suitable locations close to the pellicle stud 212 to as to provide heat energy to the pellicle stud 212 through induction heating when in operation.

A system controller 556, much like a computing device, generally includes a central processing unit (CPU), a memory, and support circuit. The system controller 556 is utilized to control the operation of the attachment feature removal apparatus 550. The CPU may be one of any form of a general purpose computer processor that can be used in an industrial setting. The support circuits are conventionally coupled to the CPU and may comprise cache, clock circuits, input/output subsystems, power supplies, and the like. The software routines transform the CPU into a specific purpose computer (controller). The software routines may also be stored and/or executed by a second controller (not shown) that is located remotely from the attachment feature removal apparatus 550.

At optional operation 404, the photomask 202 may be maintained at an elevated temperature, such as greater than 50 degrees Celsius but less than 150 degrees Celsius, such as between 80 degrees Celsius and 120 degrees Celsius. The photomask 202 may be positioned on a heating device 555, such as a curing plate, heating plate or any suitable heating device disposed in the attachment feature removal apparatus 550, as needed. Alternatively, the attachment feature removal apparatus 550 may serve as a heating device, such as an oven or an enclosure capable of providing thermal energy that can provide gentle heat energy to the photomask 202. Unlike the conventional practices that require the photomask 202 to be heated in a high temperature environment, such as heating the photomask to a temperature range greater than 300 degrees Celsius, the mild temperature elevation to the photomask 202 in the attachment feature removal apparatus 550 may gently assist softening or melting the adhesive layer 210 without damaging the features 218, 207 and the film stack 204 disposed on the photomask 202. Thus, maintaining the photomask 202 at a relatively low temperature range, such as less than 250 degrees, during the attachment feature removal process 400, the likelihood of damage resulting from the pellicle stud pulling process may be greatly diminished or even eliminated.

At operation 406, as discussed above, power is applied to the coil assembly 508 disposed around the pellicle stud gripper 504. The power applied to the coil assembly 508 may generate current in the coil assembly 508, thus generating induction heating inside the pellicle stud 212. Such heat may transmit the heat flux to the adhesive layer 210 to locally heat the adhesive layer 210 so that the interface between the pellicle stud 212 and the adhesive layer 210 is then softened by the heat provided from the heated pellicle stud 212.

At operation 408, once the adhesive layer 210 at the interface between the pellicle stud 212 and the adhesive layer 210 is softened by the fast heat energy from the heated pellicle stud 212 along with the heat energy from the attachment feature removal apparatus 550, if any, the pellicle stud gripper 504 is then aligned in a position gripping the pellicle stud 212 and a mechanical force may be applied to the actuator 502 to pull the pellicle stud 212 from the photomask 202 using the pellicle stud gripper 504.

Figure 6:
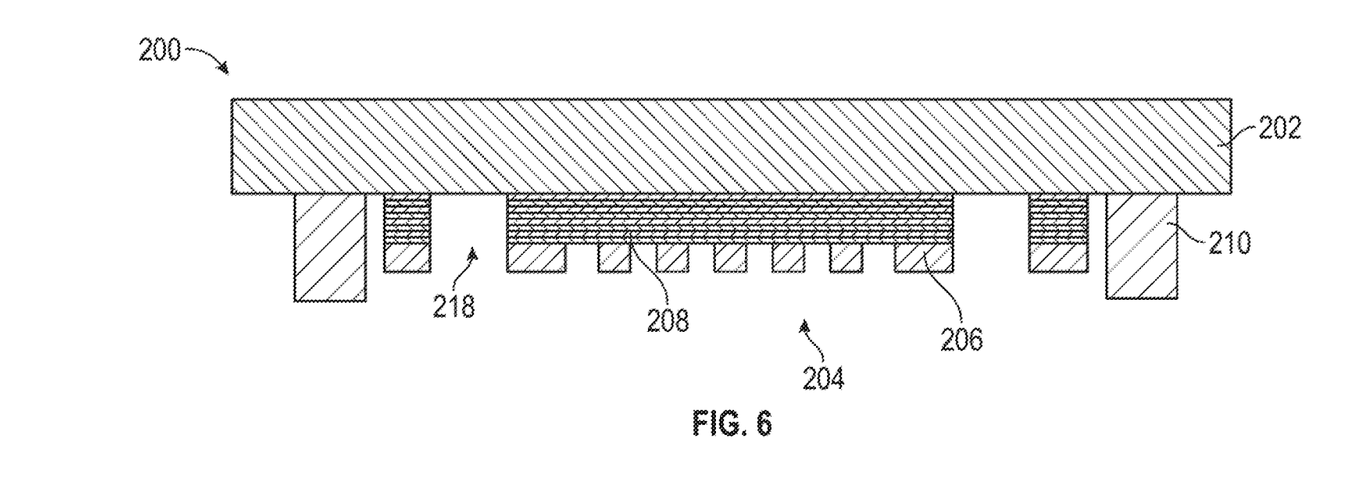
FIG. 6 depicts a cross sectional views of a photomask after a pellicle stud is removed from the photomask.
Figure 7:
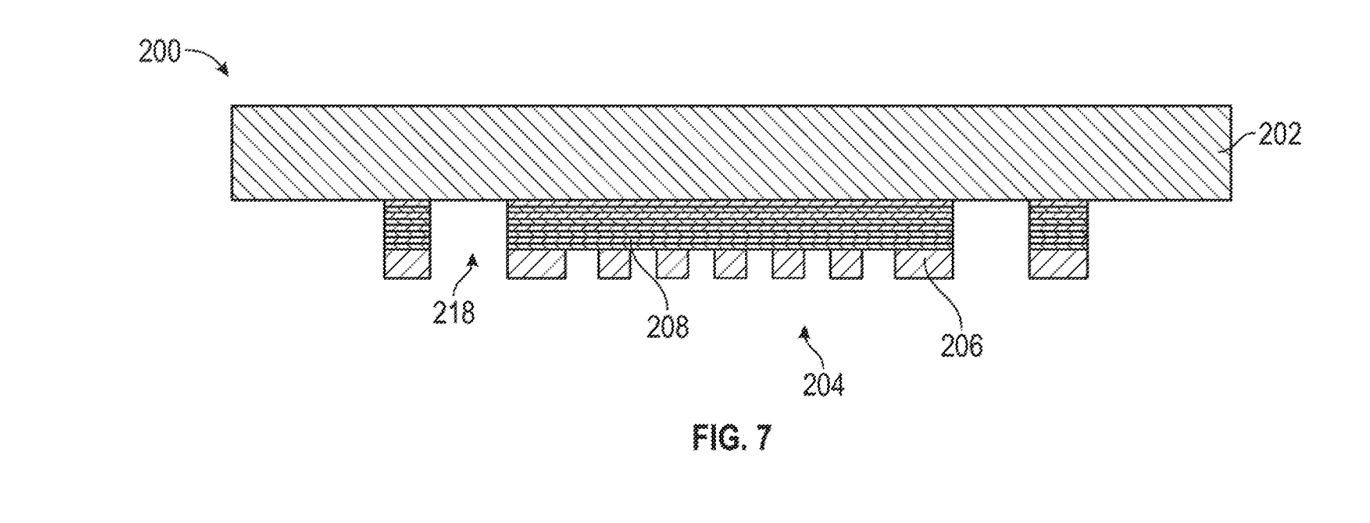
FIG. 7 depicts a cross sectional view of a photomask after an adhesive layer is removed from the photomask.

In the example depicted in FIG. 6, only the pellicle stud 212 is removed from the photomask 202 while the adhesive layer 210 remains on the photomask 202. Thus, an additional cleaning process or adhesive removal process may be required to remove the adhesive layer 210 from the photomask 202, as shown in FIG. 7. In some examples, when the mechanical force from the actuator is strong enough to pull both the pellicle stud 212 and the adhesive layer 210 from the photomask 202, as shown in FIG. 7, an additional adhesive removal process may be eliminated as needed.

Although only a lithography process is described in accordance with the present disclosure, embodiments of the present disclosure may be applied to any suitable process and in any suitable processing tools that requires removal an attachment feature from an object.

Thus, embodiments of the present disclosure generally provide apparatus and methods for removing an attachment feature from a photomask. The methods and apparatus advantageously removing the attachment feature from the photomask by an induction heating energy supplied through an inductive coil disposed around a pellicle stud gripper so as to soften the interface between the attachment feature and the photomask, thus assisting pulling the attachment feature from the photomask. Accordingly, the method and the apparatus provided herein advantageously facilitate fabrication of photomasks which is suitable for utilization in EUV technologies.

While the foregoing is directed to embodiments of the present disclosure, other and further embodiments of the disclosure may be devised without departing from the basic scope thereof, and the scope thereof is determined by the claims that follow.

What is claimed is:

1. An attachment feature removal apparatus for processing a photomask, comprising:
   an attachment feature puller further comprising:
      a pellicle stud gripper having one or more sidewalls surrounding an opening, the stud gripper comprising:
         a clamp disposed in the opening, the clamp adapted to grip an attachment feature; and
         a coil assembly disposed around the sidewalls.

2. The attachment feature removal apparatus of claim 1, wherein the one or more sidewalls of the pellicle stud gripper further comprises:
   a pair of sidewalls connected by a bottom, wherein the opening is defined between the pair of sidewalls.

3. The attachment feature removal apparatus of claim 1, wherein the pellicle stud gripper is fabricated from an insulating material.

4. The attachment feature removal apparatus of claim 3, wherein the insulating material is fabricated from refractory materials.

5. The attachment feature removal apparatus of claim 2, wherein the clamp is disposed against the sidewalls of the pellicle stud gripper.

6. The attachment feature removal apparatus of claim 1, the clamp is fabricated from a refractory material.

7. The attachment feature removal apparatus of claim 1, wherein the coil assembly is a heating device.

8. The attachment feature removal apparatus of claim 7, wherein the coil assembly generates heat inside the pellicle stud gripper by an induction current in the pellicle stud gripper.

9. The attachment feature removal apparatus of claim 7, wherein the attachment feature removal apparatus comprises one or more attachment feature pullers.

10. A method for removing an attachment feature from a photomask, comprising:
    positioning an attachment feature puller to surround an attachment feature disposed on a photomask;
    heating the attachment feature by induction heating with a heater coil disposed around the attachment feature;
    moving the attachment feature puller to grip attachment feature;
    applying a mechanical force to the attachment feature puller; and
    removing the attachment feature from the photomask.

11. The method of claim 10, wherein the attachment feature further comprises a pellicle stud disposed on an adhesive layer disposed on the photomask.

12. The method of claim 10, wherein heating the attachment feature further comprises:
applying power to a coil assembly disposed near the attachment feature puller.

13. The method of claim 12, wherein the coil assembly is circumscribing the attachment feature.

14. The method of claim 12, further comprising:
softening an adhesive layer in the attachment feature.

15. The method of claim 10, wherein positioning the attachment feature puller further comprises:
providing a heating energy to the photomask.

16. The method of claim 15, further comprising:
maintaining a photomask temperature less than 150 degrees Celsius.

17. The method of claim 10, wherein applying the mechanical force to the attachment feature puller further comprises:
actuating an actuator disposed in the attachment feature puller.

18. The method of claim 10, wherein positioning the attachment feature puller further comprises:
gripping the attachment feature by a pellicle stud gripper disposed in the attachment feature puller.

19. An attachment feature removal apparatus for processing a photomask, comprising:
a clamp coupled to an actuator disposed in the attachment feature removal apparatus, wherein the clamp is fabricated from an insulating material; and
a coil assembly disposed around and circumscribing the clamp wherein the coil assembly heats the clamp.

* * * * *